United States Patent
Chang et al.

[11] Patent Number: 5,915,201
[45] Date of Patent: Jun. 22, 1999

[54] TRENCH SURROUNDED METAL PATTERN

[75] Inventors: Peter Chang; Chen-Chiu Hsue, both of Hsin-Chu; Water Lur, Taipei, all of Taiwan

[73] Assignee: United Microelectronics Corporation, Taiwan

[21] Appl. No.: 08/960,771

[22] Filed: Oct. 30, 1997

Related U.S. Application Data

[63] Continuation of application No. 08/562,205, Nov. 22, 1995, abandoned.

[51] Int. Cl.$^6$ .................................................. H01L 21/28
[52] U.S. Cl. ........................... 438/631; 438/926; 438/669; 438/699
[58] Field of Search .................................. 438/622, 631, 438/666, 669, 778, 784, 699, 926

[56] References Cited

U.S. PATENT DOCUMENTS

| | | | |
|---|---|---|---|
| 5,004,704 | 4/1991 | Maeda et al. | 437/240 |
| 5,032,890 | 7/1991 | Ushiku et al. | 357/41 |
| 5,124,275 | 6/1992 | Selle et al. | 437/195 |
| 5,166,101 | 11/1992 | Lee et al. | 437/240 |
| 5,182,235 | 1/1993 | Egochi | 437/235 |
| 5,192,715 | 3/1993 | Sliwa, Jr. et al. | 437/195 |
| 5,278,103 | 1/1994 | Mallon et al. | 437/240 |
| 5,281,555 | 1/1994 | Cho | 437/195 |
| 5,310,700 | 5/1994 | Lien et al. | 437/195 |
| 5,357,140 | 10/1994 | Kozasa | 257/752 |
| 5,407,860 | 4/1995 | Stoltz et al. | 437/195 |
| 5,441,915 | 8/1995 | Lee | 437/195 |
| 5,459,093 | 10/1995 | Kuroda et al. | 438/926 |
| 5,476,817 | 12/1995 | Numata | 437/195 |
| 5,494,853 | 2/1996 | Lur | 437/235 |
| 5,516,720 | 5/1996 | Lur et al. | 437/927 |
| 5,556,805 | 9/1996 | Tanizawa et al. | 438/926 |

FOREIGN PATENT DOCUMENTS

| | | |
|---|---|---|
| 62-265741 | 11/1987 | Japan . |
| 03016223 | 1/1991 | Japan . |

OTHER PUBLICATIONS

Wolf, Stanley, "Silicon Processing for the VLSI Era", vol. 2, pp. 200–204.

*Primary Examiner*—Charles Bowers
*Assistant Examiner*—Matthew Whipple
*Attorney, Agent, or Firm*—Rabin & Champagne, P.C.

[57] ABSTRACT

A new method of forming the dielectric layer of an integrated circuit using metal layout is described. An insulating layer is formed over semiconductor device structures in and on a semiconductor substrate. Metal lines are formed overlying the insulating layer wherein the metal line mask is modified so that narrow trenches with constant width and depth are etched surrounding the metal lines and the remaining metal areas are not etched away but are left as dummy metal areas. The dummy metal areas are also etched into island pieces with size similar to the feature size. Narrow trenches with the same constant width and depth surround the dummy metal islands. A dielectric layer is deposited over the metal lines and dummy metal islands wherein voids are formed within the trenches between metal lines and wherein the top surface of the dielectric layer is planarized. The voids act to release system stress and to lower capacitance between the metal lines. The extra trenches between the dummy metal islands further lower parasitic capacitance and decrease the possibility of shorting between metal lines as well as reduce the loading effect during metal etching.

19 Claims, 4 Drawing Sheets

TRENCH SURROUNDED METAL PATTERN

This is a continuation of application Ser. No. 08/562,205, filed Nov. 22, 1995 and now abandoned.

RELATED PATENT APPLICATIONS

1) Co-pending U.S. patent application Ser. No. 08/280,221 (UMC94-017) filed on Jul. 25, 1994, now U.S. Pat. No. 5,494,853, to "To Solve Holes in Passivation by Metal Layout" by Water Lur. 2) Co-pending U.S. patent application Ser. No. 08/345,128 (UMC94-023) filed on Nov. 28, 1994 to "Trench Surrounded Metal Pattern" by Water Lur et al.

BACKGROUND OF THE INVENTION (1) Field of the Invention

The invention relates to a method of improving step coverage of a dielectric layer over metal lines, and more particularly, to a method of improving step coverage of a dielectric layer over metal lines by surrounding the metal lines with trenches and dummy metal island areas in the fabrication of integrated circuits.

(2) Description of the Prior Art

Conventional metal layout is function dominated and metal lines are located at random. Metal line spacings vary considerably. Therefore, step coverage of subsequent intermetal dielectric or passivation layers is inevitably unacceptable. The resulting bad planarization causes reliability problems. Referring to FIG. 1, there is shown a top plan view of metal lines of the prior art. Metal lines 20 and 22 have been formed overlying insulating layer 16. View 2—2 of FIG. 1 is shown in FIG. 2 as a cross-section. When dielectric or passivation layer 28 is deposited over the metal lines 20 and 22, the layer is not planarized especially between widely spaced metal lines 20 and 22. This results in bad step coverage of the overlayers. The step coverage of the passivation layer on high aspect ratio metal lines is very poor— less than 40%. In addition, the large step height will challenge the depth of focus of photolithography and thus narrow the process window. Moreover, etching residue for the overlayer is easily formed at the bottom corner 34, causing a stringer problem.

Keyhole type tunnels 30 are formed within the dielectric layer between metal lines with spacing smaller than about 1 micrometer. These tunnels open up at metal line terminals, at points where the underlying metal layer is absent, and at turns in metal lines. During resist coating, the resist sinks into the underlying tunnels, making the resist layer thinner in these areas. The thinner resist generates holes in the passivation layer after pad etch which then degrades reliability. The sunken resist also causes a resist residue problem.

U.S. Pat. No. 5,032,890 to Ushiku et al describes the formation of dummy lines for improved next level coverage of an interconnection layer.

SUMMARY OF THE INVENTION

A principal object of the present invention is to provide an effective and very manufacturable method of forming the dielectric layer of an integrated circuit.

Another object of the present invention is to provide a method of forming the dielectric layer of an integrated circuit with improved step coverage over metal lines.

A further object of the invention is to provide for stress relaxation of the integrated circuit.

Yet another object is to provide capacitance reduction of the integrated circuit.

Yet another object of the invention is to decrease the possibility of shorting between metal lines.

A still further object is to reduce the loading effect during metal etching.

In accordance with the objects of this invention a new method of forming the dielectric layer of an integrated circuit using metal layout is achieved. An insulating layer is formed over semiconductor device structures in and on a semiconductor substrate. Metal lines are formed overlying the insulating layer wherein the metal line mask is modified so that narrow trenches with constant width and depth are etched surrounding the metal lines and the remaining metal areas are not etched away but are left as dummy metal areas. The dummy metal areas are also etched into island pieces with size similar to the feature size. Narrow trenches with the same constant width and depth surround the dummy metal islands. A dielectric layer is deposited over the metal lines and dummy metal islands wherein voids are formed within the trenches between metal lines and wherein the top surface of the dielectric layer is planarized. The voids act to release system stress and to lower capacitance between the metal lines. The extra trenches between the dummy metal islands further lower parasitic capacitance and decrease the possibility of shorting between metal lines as well as reduce the loading effect during metal etching.

Also in accordance with the objects of the invention, an improved integrated circuit device is achieved. The integrated circuit device comprises a dielectric layer overlying semiconductor device structures in a semiconductor substrate. Conducting lines overlie the dielectric layer wherein the conducting lines are surrounded by trenches in the dielectric layer. Voids are formed within the trenches. Dummy conducting island areas are separated from each other and from the conducting lines by trenches in the dielectric layer. The dummy conducting island areas have a size on the order of the feature size of the semiconductor device structures. Voids are formed within the trenches. A passivation layer overlies the conducting lines and the dummy conducting island areas.

BRIEF DESCRIPTION OF THE DRAWINGS

In the accompanying drawings forming a material part of this description, there is shown.

DETAILED DESCRIPTION OF THE PREFERRED EMBODIMENTS

In related patent application Ser. No. 08/345,128 (UMC94-023) and in the present invention, the metal line pattern is defined by surrounded trench etching. Dummy metal areas are located between functional metal lines. The trenches surrounding the metal lines have about the same width and depth. It is very easy to form a planarized dielectric over such a metal layer. The original metal line mask is modified to allow for narrow etched trenches surrounding the functional metal lines leaving non-functional metal everywhere else.

Figure 1:
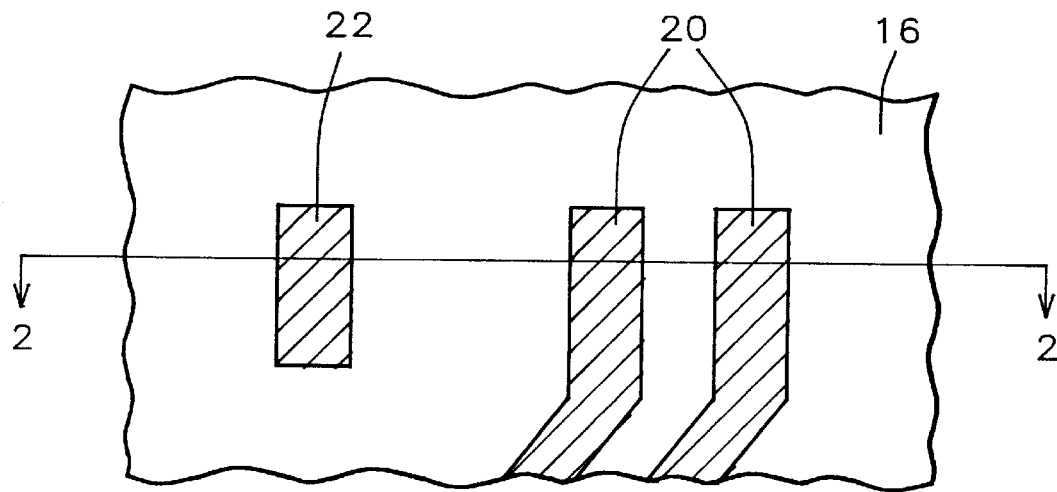
FIG. 1 schematically illustrates a top view of metal lines of the prior art.
Figure 2:
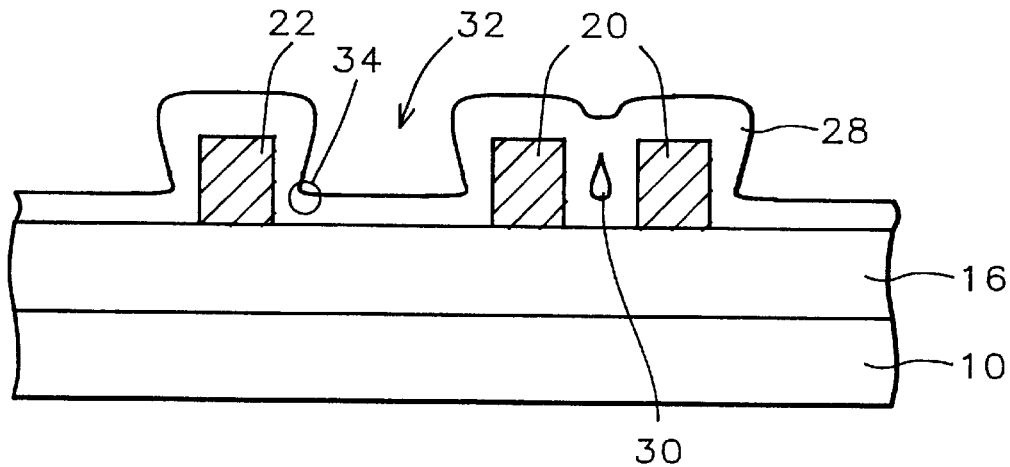
FIG. 2 schematically illustrates in cross-sectional representation metal lines of the prior art.
Figure 3:
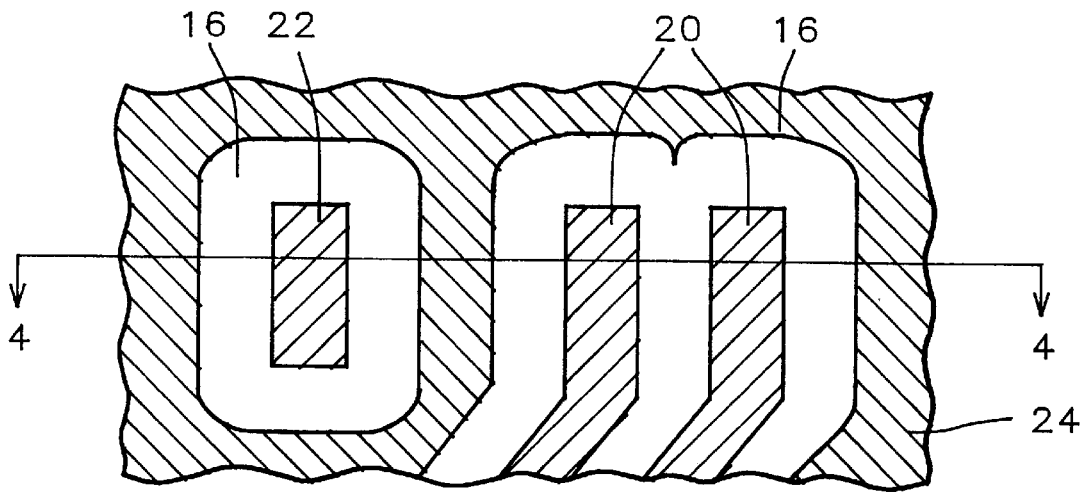
FIG. 3 schematically illustrates a top view of trench surrounded metal lines.

Referring now to FIG. 3, a top plan view of the trench surrounded metal lines of related patent application Ser. No. 08/345,128 (UMC94-023) is shown. Metal lines 20 and 22 are formed over insulating layer 16. The metal lines are defined by the trenches surrounding them. All remaining metal 24 is left as dummy metal areas which are non-functional, but which allow for overall planarization.

Figure 4:
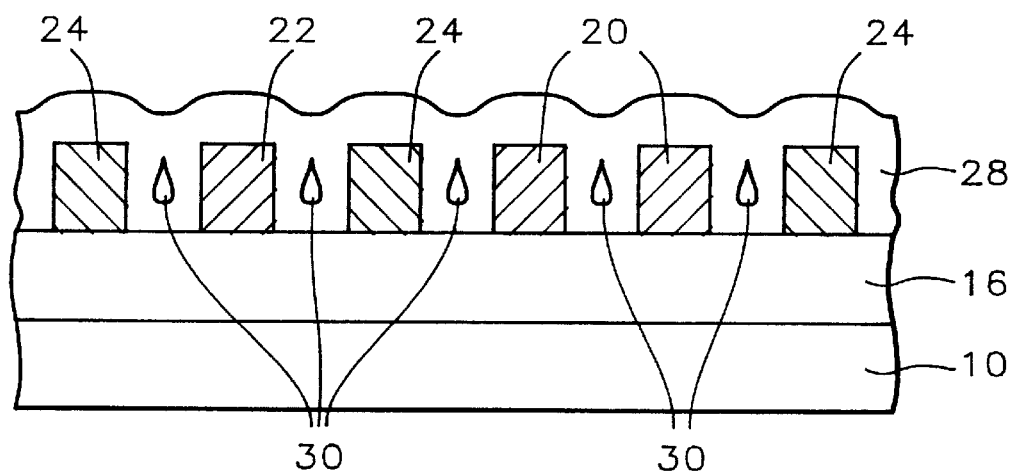
FIG. 4 schematically illustrates in cross-sectional representation trench surrounded metal lines.

FIG. 4 illustrates view 4—4 of FIG. 3. Semiconductor substrate 10 may be a monocrystalline silicon substrate or may contain semiconductor device structures and lower level interconnection on a monocrystalline silicon substrate. Insulating layer 16 covers the surface of the semiconductor substrate. Dielectric or passivation layer 28 is planarized. No wide spaces exist between metal lines to cause poor step coverage. Trenches of approximately constant width and depth lie between each metal area, functional and non-functional. The keyhole tunnels 30 do not open up because there are no large areas where the metal layer is absent. The turns in the metal lines have the same width trenches as the straight parts of the lines so the tunnels will not tend to open there as they do in the prior art.

Figure 5:
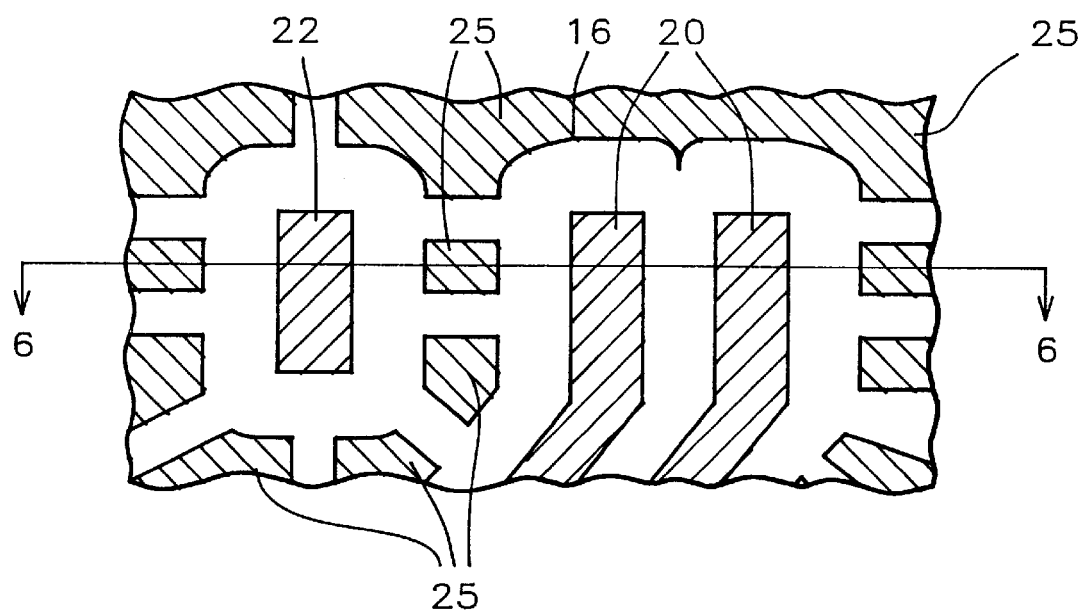
FIG. 5 schematically illustrates a top view of the improved trench surrounded metal lines of the present invention.

The present invention is an improvement over the trench surrounded metal pattern of the related patent application Ser. No. 08,345,128 (UMC94-023). Referring now to FIG. 5, the dummy metal areas are cut into island pieces 25. The dummy metal islands 25 have a size similar to the feature size. Trenches are formed between the islands with the same width and depth as those between the functional metal lines. Therefore, trenches are formed between functional metal lines as well as between dummy metal islands.

The location of the trenches is determined during metal layout. The new kind of metal layout will reduce the probability of metal shorting caused by the presence of particles just in the trenches so as to improve product yield. Particles are usually generated during processing such as etching, cleaning, etc. The particles may be impurities in a chemical solution, metal or oxide particles, or by-products of etching. Particles can cause shorting between metal lines when they are found in the trenches.

Figure 7:
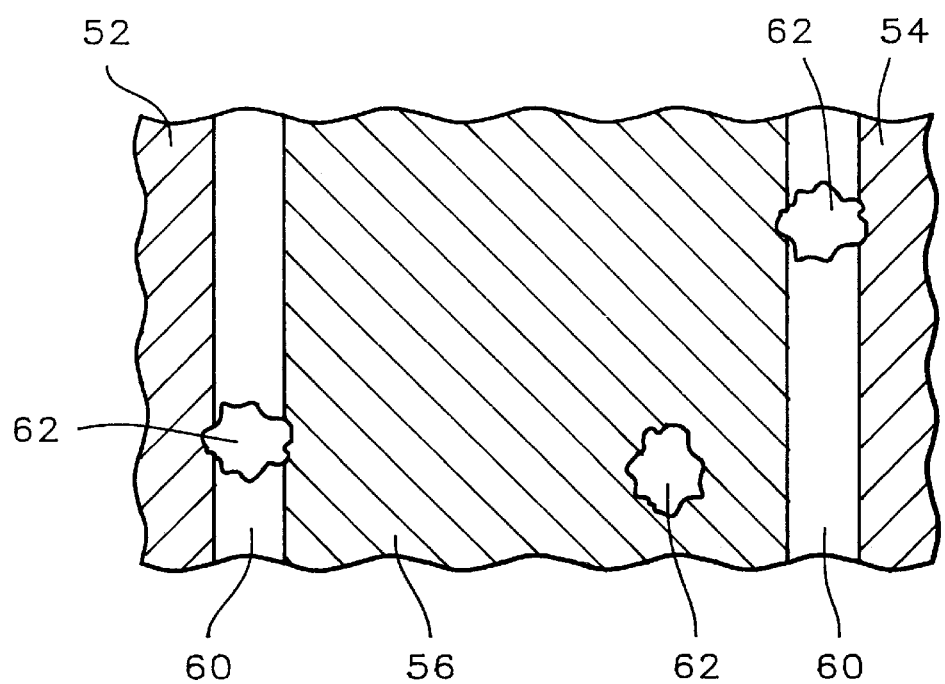
FIG. 7 schematically illustrates a top view of trench surrounded metal lines in which particles are generated.

Referring now to FIG. 7, there is shown a top view of functional metal lines 52 and 54. A large dummy metal area 56 is separated from the metal lines by trenches 60. Particles 62 have been generated during normal processing as described above. Once two or more particles are located in the trenches adjacent to lines 52 and 54, the metal lines will be shorted resulting in function failure.

Figure 8:
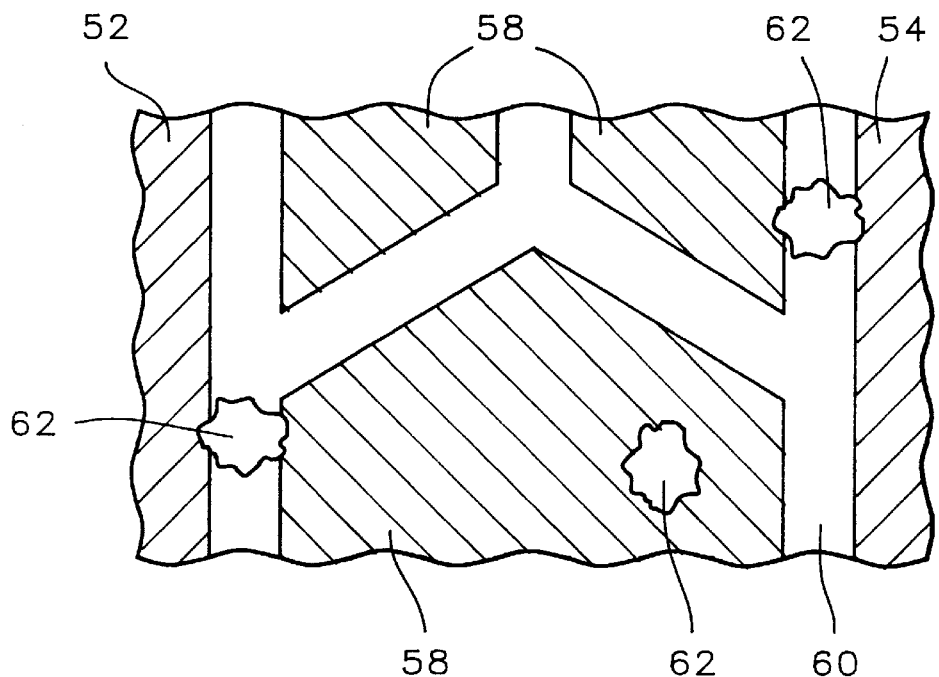
FIG. 8 schematically illustrates a top view of the improved trench surrounded metal lines of the present invention in which particles are generated.

Referring now to FIG. 8, there is shown a top view of the improved layout of the present invention in which dummy metal islands 58 are formed between metal lines 52 and 54, defined by trenches 60. The same particles 62 located at the same two trenches do not cause shorting of the metal lines 52 and 54.

A further advantage of the present invention is reduction in the loading effect during metal etching. Etching rates are different from region to region because the amount reaction gases supplied per unit area is the same while the patterns on the wafer are different from region to region, requiring more or less etching. This is the loading effect. In the present invention, all the dummy areas are disintegrated into several isolated dummy islands with sizes similar to the functional metal lines. Since there are no longer special regions of larger size, the loading effect will be minimized.

The typical trench width is less than about 0.8 microns. This will allow for the formation of the keyhole tunnels, or voids. These voids between the metal lines are used to reduce system stress and to lower the parasitic capacitance between the metal lines, especially in the sub half-micron area, to improve the speed of the circuits. Capacitance $C = \epsilon A/t$, where A is the conductor area which is the product of height by length for parallel metal lines, $\epsilon$ is the dielectric constant of the inter-metal dielectric material, and t is the thickness of dielectric material. The $\epsilon$'s of $SiO_2$, $Si_3N_4$, and air are about 4.0, 7.5, and 1.0, respectively. Therefore, the presence of voids between metal lines can reduce parasitic capacitance. In the improved metal layout of the present invention, the parasitic capacitance between metal lines is also considerably reduced by the presence of extra trenches between the dummy metal islands, and therefore, extra voids within the extra trenches.

Figure 6:
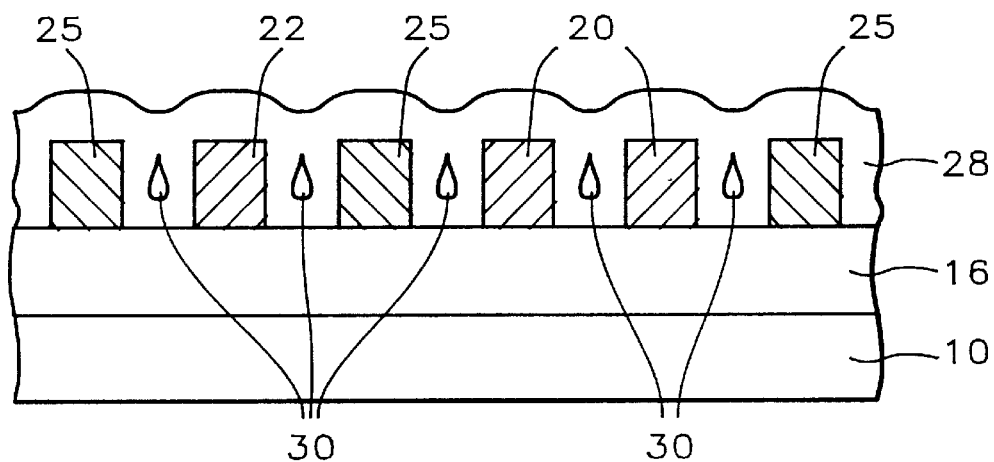
FIG. 6 schematically illustrates in cross-sectional representation the improved trench surrounded metal lines of the present invention.

FIG. 6 illustrates view 6—6 of FIG. 5. Semiconductor substrate 10 may be a monocrystalline silicon substrate or may contain semiconductor device structures and lower level interconnection on a monocrystalline silicon substrate. Insulating layer 16 covers the surface of the semiconductor substrate. Dielectric or passivation layer 28 is planarized. No wide spaces exist between metal lines to cause poor step coverage. Trenches of approximately constant width and depth lie between each metal area, functional and non-functional. The keyhole tunnels, or voids 30 do not open up because there are no large areas where the metal layer is absent. The turns in the metal lines have the same width trenches as the straight parts of the lines so the tunnels will not tend to open there as they do in the prior art.

Figure 9:
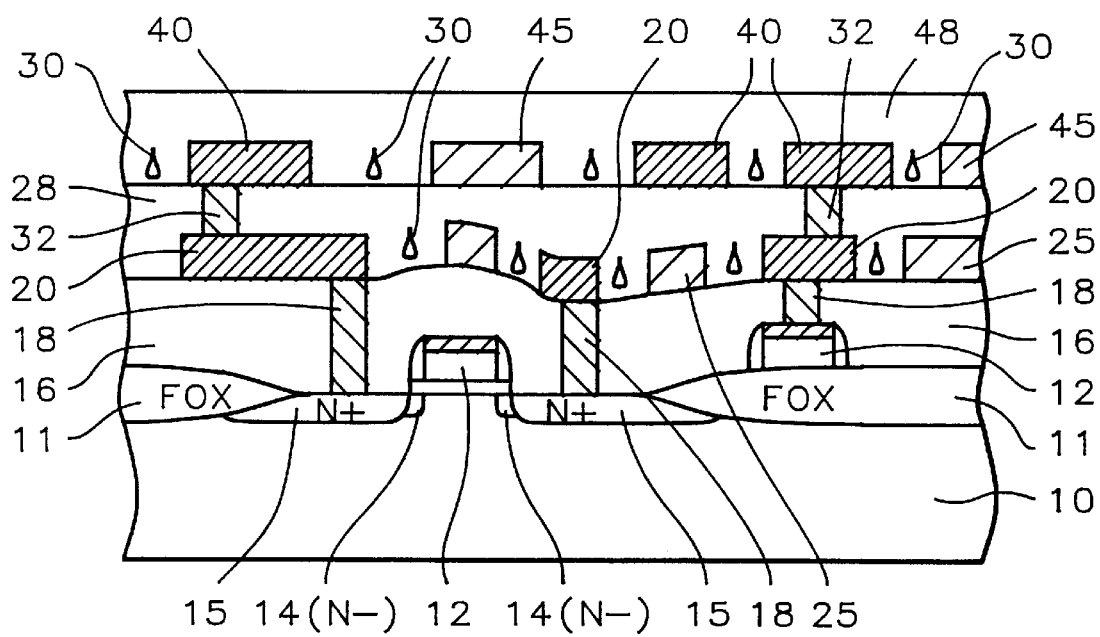
FIG. 9 schematically illustrates in cross-sectional representation a completed integrated circuit deivce of the present invention.

Referring now to FIG. 9, there is illustrated a completed integrated circuit fabricated according to the process of the present invention. Semiconductor device structures including gate electrodes 12 and source and drain regions 15 have been formed in and on semiconductor substrate 10. Dielectric layer 16 covers the semiconductor device structures. Openings are made through the insulating layer 16 to the semiconductor substrate and to the semiconductor device structures to which contact is to be made, as shown. Tungsten plugs, or the like, 18 fill the contact openings. A first metal layer is deposited over the insulating layer 16. The metal layer is patterned according to the invention in which trenches are etched surrounding the metal lines and surrounding dummy metal islands which form non-functional metal lines. Functional metal lines 20 and non-functional metal lines 25 are shown. The trenches between both functional and non-functional metal lines are of about the same width.

Intermetal dielectric layer 28 is deposited over the patterned first metal layer resulting in a planarized layer in which keyhole tunnels 30 are formed within the trenches between metal lines. Openings are made through the intermetal dielectric layer 28 to the first metal layer where contacts are to be made. The contact openings are filled with tungsten plugs, or the like, 32.

A second metal layer is deposited over the intermetal dielectric layer 28 and patterned according to the process of the invention in which trenches are etched surrounding the metal lines and surrounding dummy metal islands which form non-functional metal lines. Functional metal lines 40 and non-functional metal lines 45 are shown. The trenches between both functional and non-functional metal lines are of about the same width.

Passivation layer 48 is deposited over the patterned second metal layer resulting in a planarized layer in which keyhole tunnels 30 are formed within the trenches between metal lines. This completes the integrated circuit.

The metal layout of the present invention allows overall planarization of a dielectric or passivation layer over patterned metal layer. It promotes the formation of keyhole tunnels between metal lines, but prevents the formation of openings to the tunnels. This prevents the generation of holes in the overlying passivation layer caused by resist thinning because the resist does not sink into the tunnels. The tunnels provide for stress relaxation in the system and lowered capacitance between metal lines to improve the speed of the circuits. Furthermore, the dummy metal islands of size similar to the feature size rather than large dummy metal areas reduces the loading effect during metal etching. They also reduce the probability of metal shorting due to the presence of particles in the trenches and further reduce the parasitic capacitance by the presence of extra trenches between the dummy metal islands.

While the invention has been particularly shown and described with reference to the preferred embodiments thereof, it will be understood by those skilled in the art that various changes in form and details may be made without departing from the spirit and scope of the invention.

What is claimed is:

1. A method of planarizing an integrated circuit comprising:

forming semiconductor device structures in a semiconductor substrate;

depositing a conducting layer over said semiconductor device structures;

forming a plurality of conducting lines and a plurality of dummy island regions from said conducting layer by etching trenches of only one essentially constant width in said conducting layer to define a perimeter of said conducting lines and said dummy island regions, said trenches having a rounded, outer profile at respective terminal corners of said conducting lines so that all of the respective trenches have an essentially constant, similar width around terminal ends of said conducting lines, and said dummy island regions having a variety of different shapes; and depositing a substantially planarized dielectric layer overlying said conducting lines and said dummy island areas.

2. The method according to claim 1, wherein the dielectric layer is additionally deposited within the trenches and wherein voids are formed within the dielectric layer within all of said trenches between said conducting lines and said dummy island regions, each of said voids being centered within a corresponding trench and maintained at a level below upper surfaces of adjacent conducting lines.

3. The method according to claim 1 wherein all of said trenches have approximately the same depth.

4. The method according to claim 1 wherein said dummy conducting island areas have a size on the order of the feature size of said semiconductor device structures.

5. A method of planarizing an integrated circuit comprising:

forming semiconductor device structures in a semiconductor substrate;

depositing a conducting layer over said semiconductor device structures;

forming conducting lines and dummy conducting island areas in said conducting layer by etching trenches surrounding said conducting lines and between said island areas wherein said dummy conducting island areas have a size on the order of the feature size of said semiconductor device structures, at least one dummy conducting island area lying between first and second adjacent conducting lines, said first conducting line separated from first and second dummy conducting island areas only by a first trench and said second conducting line separated from said first and second dummy conducting island areas only by a second trench, a third trench extending between first and second dummy conducting island areas being configured so that providing a first particle filling the first trench and a second particle filling the second trench does not complete a circuit between said first and second conducting lines, said trenches having a rounded, outer profile at respective terminal corners of said conducting lines so that each of the respective trenches has an essentially constant width around a terminal end of said respective conducting lines; and depositing a substantially planarized dielectric layer overlying said conducting lines and said dummy conducting island areas.

6. The method according to claim 5, wherein the dielectric layer is additionally deposited within the trenches and wherein voids are formed within the dielectric layer within said trenches between said conducting lines and said dummy conducting island areas.

7. A method of planarizing an integrated circuit comprising:

forming semiconductor device structures in a semiconductor substrate;

forming a first conducting layer over said semiconductor device structures;

forming a first set of conducting lines and a first set of dummy conducting island areas in said first conducting layer by etching a first set of trenches surrounding said first set of conducting lines and between said dummy conducting island areas, at least one of said first set of conducting lines completely surrounded by a plurality of said dummy conducting areas separated by constant width trenches of said first set, said trenches having a rounded, outer profile at respective terminal corners of said first set of conducting lines so that each of the respective trenches has an essentially constant width around a terminal end of said respective conducting lines so that ends of said one of said first conducting lines are separated from said dummy conducting areas by constant distance;

depositing a dielectric layer overlying said first set of conducting lines and said first set of dummy conducting island areas;

forming contact openings through said dielectric layer to said underlying first set of conducting lines;

depositing a second conducting layer over said dielectric layer and within said contact openings;

forming a second set of conducting lines and a second set of dummy conducting island areas in said second conducting layer by etching a second set of trenches surrounding said second set of conducting lines and between said second set of dummy conducting island areas; and depositing a passivation layer overlying said second set of conducting lines and said second set of dummy conducting island areas.

8. The method according to claim 7 wherein said first set of conducting lines are electrically connected to said underlying semiconductor device structures and wherein said first set of dummy conducting island areas have no electrical contacts.

9. The method according to claim 7 wherein said second set of conducting lines electrically connect to said underlying first set of conducting lines through said contact openings and wherein said second set of dummy conducting island areas have no electrical contacts.

10. The method according to claim 7, wherein the dielectric layer is additionally deposited within the trenches and wherein voids are formed within the dielectric layer within said first set of trenches surrounding said first set of conducting lines and between said first set of dummy conducting island areas and wherein the top surface of said dielectric area is planarized.

11. The method according to claim 7, wherein the dielectric layer is additionally deposited within the trenches and wherein voids are formed within the dielectric layer within said second set of trenches surrounding said second set of conducting lines and between said second set of dummy conducting island areas and wherein the top surface of said passivation layer is planarized.

12. The method according to claim 7 wherein said first set of trenches have approximately the same width and depth.

13. The method according to claim 7 wherein said second set of trenches have approximately the same width and depth.

14. The method according to claim 7 wherein the width of said second set of trenches is smaller than twice the thickness of said subsequently deposited passivation layer.

15. A method of planarizing an integrated circuit comprising:

forming semiconductor device structures in a semiconductor substrate;

depositing a conducting layer over said semiconductor device structures;

etching a first trench in said conducting layer to form a first conducting line;

etching a second trench in said conducting layer to form a second conducting line adjacent to said first conducting line, wherein said first conducting line and second conducting line are separated by a dummy conducting area;

etching a third trench in said conducting layer, said third trench connecting said first trench to said second trench, said third trench extending through said dummy conducting area and forming first and second dummy conducting regions that are disposed on opposite sides of the third trench, said first and second dummy conducting regions disposed completely between said first conducting line and said second conducting line;

etching a fourth trench in said first dummy conducting region, said fourth trench intersecting with said third trench and forming first and second dummy conducting islands that are disposed on opposite sides of the fourth trench, wherein said trenches have a rounded, outer profile at respective terminal corners of said conducting lines so that each of the respective trenches has an essentially constant width around a terminal end of said respective conducting lines; and depositing a substantially planarized dielectric layer overlying said conducting lines and said conducting layer and trenches.

16. The method of claim 15, wherein said dummy conducting islands have a size on the order of the feature size of said semiconductor device structures.

17. The method of claim 15, wherein the dielectric layer is additionally deposited within the trenches and including the formation of voids within the dielectric layer within said trenches.

18. The method of claim 15, wherein said trenches are the same width.

19. The method of claim 15, wherein the width of said trenches is smaller than twice the thickness of said planarized dielectric layer.

* * * * *